(12) United States Patent
Meyer et al.

(10) Patent No.: US 9,461,164 B2
(45) Date of Patent: Oct. 4, 2016

(54) SEMICONDUCTOR DEVICE AND METHOD OF MANUFACTURING THE SAME

(71) Applicant: Infineon Technologies AG, Neubiberg (DE)

(72) Inventors: Thorsten Meyer, Munich (DE); Werner Schwetlick, Groebenzell (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 14/027,683

(22) Filed: Sep. 16, 2013

(65) Prior Publication Data
US 2015/0076591 A1    Mar. 19, 2015

(51) Int. Cl.
| H01L 29/78 | (2006.01) |
|---|---|
| H01L 21/28 | (2006.01) |
| H01L 21/8234 | (2006.01) |
| H01L 29/40 | (2006.01) |

(52) U.S. Cl.
CPC ..... *H01L 29/7827* (2013.01); *H01L 21/28008* (2013.01); *H01L 21/823487* (2013.01); *H01L 29/407* (2013.01); *H01L 29/7811* (2013.01); *H01L 29/7813* (2013.01)

(58) Field of Classification Search
CPC ............. H01L 29/407; H01L 29/7813; H01L 29/4236; H01L 27/088; H01L 27/0886; H01L 27/10; H01L 27/105; H01L 27/04; H01L 27/06
USPC .......................... 257/330, 334, 368–377, 500
See application file for complete search history.

(56) References Cited

U.S. PATENT DOCUMENTS

| 7,638,841 B2* | 12/2009 | Challa ........................... 257/341 |
|---|---|---|
| 7,723,783 B2* | 5/2010 | Saito et al. ................... 257/330 |
| 8,575,695 B2 | 11/2013 | Bobde et al. |
| 2003/0209757 A1 | 11/2003 | Henninger et al. |
| 2004/0173846 A1 | 9/2004 | Hergenrother et al. |
| 2006/0113625 A1 | 6/2006 | Bude et al. |
| 2008/0012067 A1 | 1/2008 | Wu |
| 2009/0242981 A1 | 10/2009 | Fujita et al. |

(Continued)

OTHER PUBLICATIONS

Meiser, et al. "Semiconductor Device Including a Fin and a Drain Extension Region and Manufacturing Method." U.S. Appl. No. 13/692,462, filed Dec. 3, 2012.

(Continued)

*Primary Examiner* — Matthew W Such
*Assistant Examiner* — David Spalla
(74) *Attorney, Agent, or Firm* — Murphy, Bilak & Homiller, PLLC

(57) ABSTRACT

A semiconductor device includes a semiconductor body having a first surface and a second surface opposite to the first surface. The semiconductor device further includes first and second trenches extending from the first surface into the semiconductor body. The semiconductor device further includes at least one lateral IGFET including a first load terminal at the first surface, a second load terminal at the first surface and a gate electrode within the first trenches. The semiconductor device further includes at least one vertical IGFET including a first load terminal at the first surface, a second load terminal at the second surface and a gate electrode within the second trenches.

13 Claims, 6 Drawing Sheets

(56) References Cited

U.S. PATENT DOCUMENTS

| | | | |
|---|---|---|---|
| 2010/0200915 A1* | 8/2010 | Denison | H01L 29/42368 257/335 |
| 2012/0009740 A1 | 1/2012 | Cheng et al. | |
| 2012/0286355 A1* | 11/2012 | Mauder et al. | 257/330 |
| 2013/0049074 A1* | 2/2013 | Surthi et al. | 257/208 |
| 2013/0126967 A1* | 5/2013 | Toyoda | H01L 21/823481 257/334 |
| 2013/0249602 A1* | 9/2013 | Mauder et al. | 327/108 |
| 2014/0220761 A1 | 8/2014 | Molloy et al. | |
| 2014/0252494 A1 | 9/2014 | Lui et al. | |

OTHER PUBLICATIONS

Schloesser, et al. "Semiconductor Device and Method for Manufacturing a Semiconductor Device." U.S. Appl. No. 13/627,215, filed Sep. 26, 2012.

Meiser, et al. "Semiconductor Device and Method of Manufacturing a Semiconductor Device." U.S. Appl. No. 13/731,380, filed Dec. 31, 2012.

Meiser, et al. "Semiconductor Device and Method of Manufacturing a Semiconductor Device." U.S. Appl. No. 13/692,059, filed Dec. 3, 2012.

* cited by examiner

FIG 10 forming first trenches in a first part of a semiconductor body having a first surface and a second surface opposite to the first surface and forming second trenches in a second part of the semiconductor body, the first and second trenches extending from the first surface into the semiconductor body —S100 forming, in the first part, at least one lateral IGFET comprising a first load terminal at the first surface, a second load terminal at the first surface and a gate electrode within the first trenches —S110 forming, in the second part, at least one vertical IGFET comprising a first load terminal at the first surface, a second load terminal at the second surface and a gate electrode within the second trenches —S130

FIG 11 forming an insulating zone configured to electrically insulate the at least on lateral IGFET in the first part from a region adjoining the second surface —S140

SEMICONDUCTOR DEVICE AND METHOD OF MANUFACTURING THE SAME

BACKGROUND

One application of semiconductor technology is power switches with various sensor and protection functions. NMOSFETs (n-channel metal oxide semiconductor field effect transistors), e.g. normally-on NMOSFETs, may be beneficially integrated to realize current sources anywhere within analog circuits without having to use current mirrors. Integration of a beneficial NMOS (abbr. for NMOSFET) has an impact on process variation and process complexity. It is desirable to improve process variation and process complexity of semiconductor technologies.

SUMMARY

According to an embodiment of a semiconductor device, the semiconductor device comprises a semiconductor body having a first surface and a second surface opposite to the first surface. The semiconductor device further includes first and second trenches extending from the first surface into the semiconductor body. The semiconductor device further includes at least one lateral IGFET comprising a first load terminal at the first surface, a second load terminal at the first surface and a gate electrode within the first trenches. The semiconductor device further includes at least one vertical IGFET (insulated gate field effect transistor) comprising a first load terminal at the first surface, a second load terminal at the second surface and a gate electrode within the second trenches.

According to another embodiment of a semiconductor device, the semiconductor device comprises a semiconductor body having a first surface and a second surface opposite to the first surface. The semiconductor device further includes a source zone and a drain zone at the first surface, a channel zone formed between the source zone and the drain zone and an insulating zone configured to electrically insulate the channel zone from a region adjoining the second surface. The semiconductor device further includes first trenches extending from the first surface deeper into the semiconductor body than the channel zone and confining the channel zone. The first trenches comprise a gate dielectric lining the side walls thereof and a gate electrode adjoining the gate dielectric.

According an embodiment of a method of manufacturing a semiconductor device, the method comprises forming first trenches in a first part of a semiconductor body having a first surface and a second surface opposite to the first surface and forming second trenches in a second part of the semiconductor body. The first and second trenches extend from the first surface into the semiconductor body. The method further includes forming, in the first part, at least one lateral IGFET comprising a first load terminal at the first surface, a second load terminal at the first surface and a gate electrode within the first trenches. The method further includes forming, in the second part, at least one vertical IGFET comprising a first load terminal at the first surface, a second load terminal at the second surface and a gate electrode within the second trenches.

Those skilled in the art will recognize additional features and advantages upon reading the following detailed description, and upon viewing the accompanying drawings.

BRIEF DESCRIPTION OF THE DRAWINGS

The accompanying drawings are included to provide a further understanding of embodiments of the present invention discussed herein and are incorporated in and constitute a part of the specification. The drawings illustrate embodiments of the present invention and together with the description serve to explain principles of the invention. Other embodiments of the invention and many of the advantages will be readily appreciated as they become better understood by reference to the following detailed description. The elements of the drawings are not necessarily to scale relative to each other. Like reference numerals designate corresponding similar parts.

FIG. 10 illustrates an embodiment of a process flow of manufacturing a semiconductor device.

FIG. 11 illustrates another process feature of manufacturing a semiconductor device.

DETAILED DESCRIPTION

In the following detailed description, reference is made to the accompanying drawings, which form a part hereof, and in which are shown by way of illustrations specific embodiments in which the invention may be practiced. Other embodiments may be utilized and structural and logical changes may be made without departing from the scope of the present invention. For example, features illustrated or described for one embodiment can be used on or in conjunction with other embodiments to yield yet a further embodiment. It is intended that the various embodiments of the present invention include such modifications and variations. The examples are described using specific language, which should not be construed as limiting the scope of the appending claims. The drawings are not scaled and for illustrative purpose only. For clarity, corresponding elements have been designated by the same references in the different drawings if not stated otherwise.

The terms "having," "containing," "including," "comprising" and the like are open and the terms indicate the presence of stated structures, elements or features but not preclude additional elements or features.

The terms "one after another," "successively" and the like indicate a loose ordering of elements not precluding additional elements placed in between the ordered elements.

The articles "a," "an," and "the" are intended to include the plural as well as the singular, unless the context clearly indicates otherwise.

In this specification, p-type or p-doped may refer to a first conductivity type while n-type or n-doped is referred to a second conductivity type. Semiconductor devices can be formed with opposite doping relations so that the first conductivity type can be p-doped and the second conductivity type can be n-doped. Furthermore, some figures illustrate relative doping concentrations by indicating "−" or "+" next to the doping type. For example, "n⁻" means a doping concentration less than the doping concentration of an "n"-doping region while an "n⁺"-doping region has a larger doping concentration than the "n"-doping region. Indicating the relative doping concentration does not, however, mean that doping regions of the same relative doping concentration have the same absolute doping concentration unless otherwise stated. For example, two different n$^+$ regions can have different absolute doping concentrations. The same applies, for example, to an n$^+$ and a p$^+$ region.

The first conductivity type may be n- or p-type provided that the second conductivity type is complementary.

The term "electrically connected" describes a permanent low-ohmic connection between electrically connected elements, for example a direct contact between the concerned elements or a low-ohmic connection via a metal and/or highly doped semiconductor.

The features of the various embodiments described herein may be combined with each other, unless specifically noted otherwise.

Figure 1:
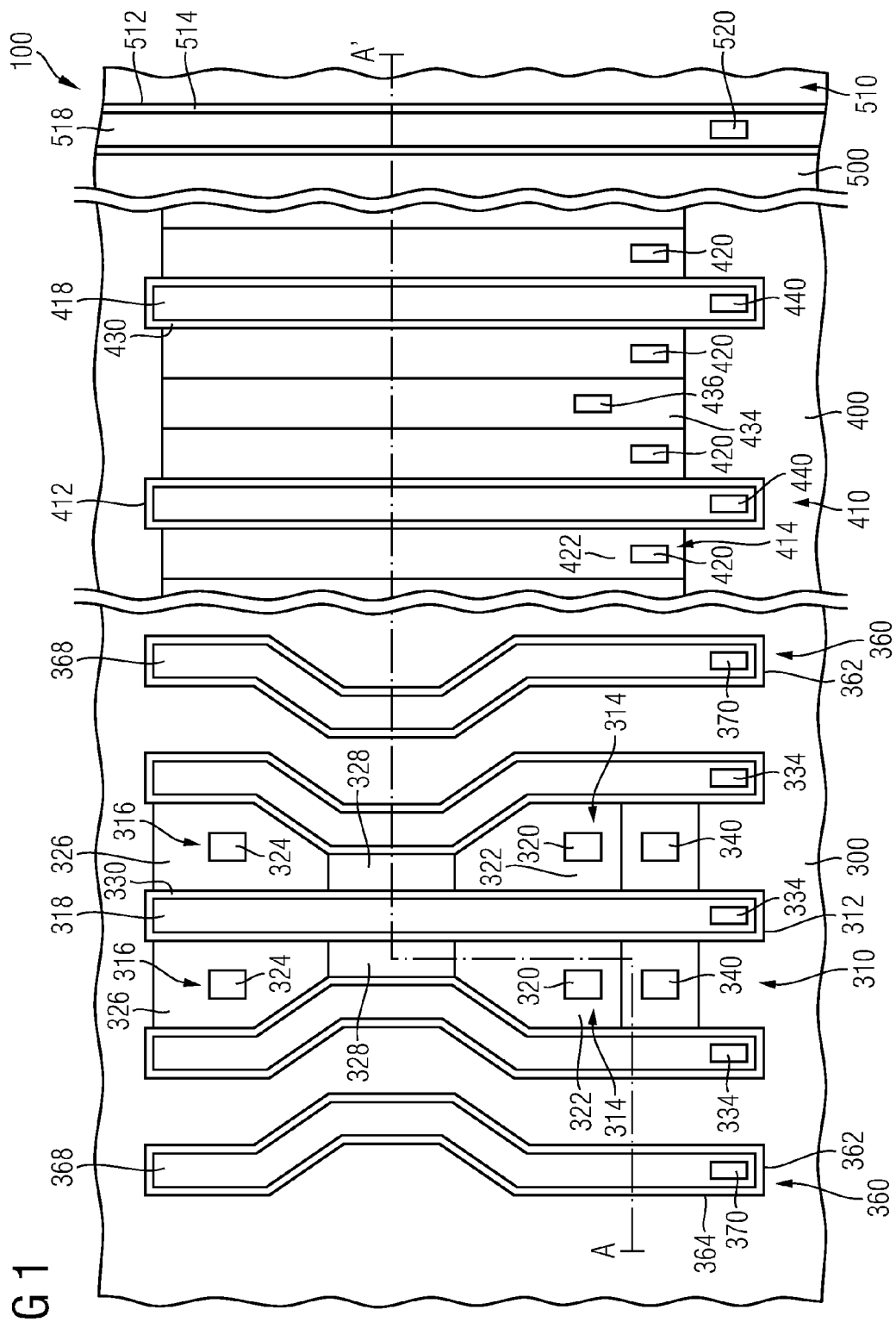
FIG. 1 is a schematic plan view of an embodiment of a semiconductor device.
Figure 2:
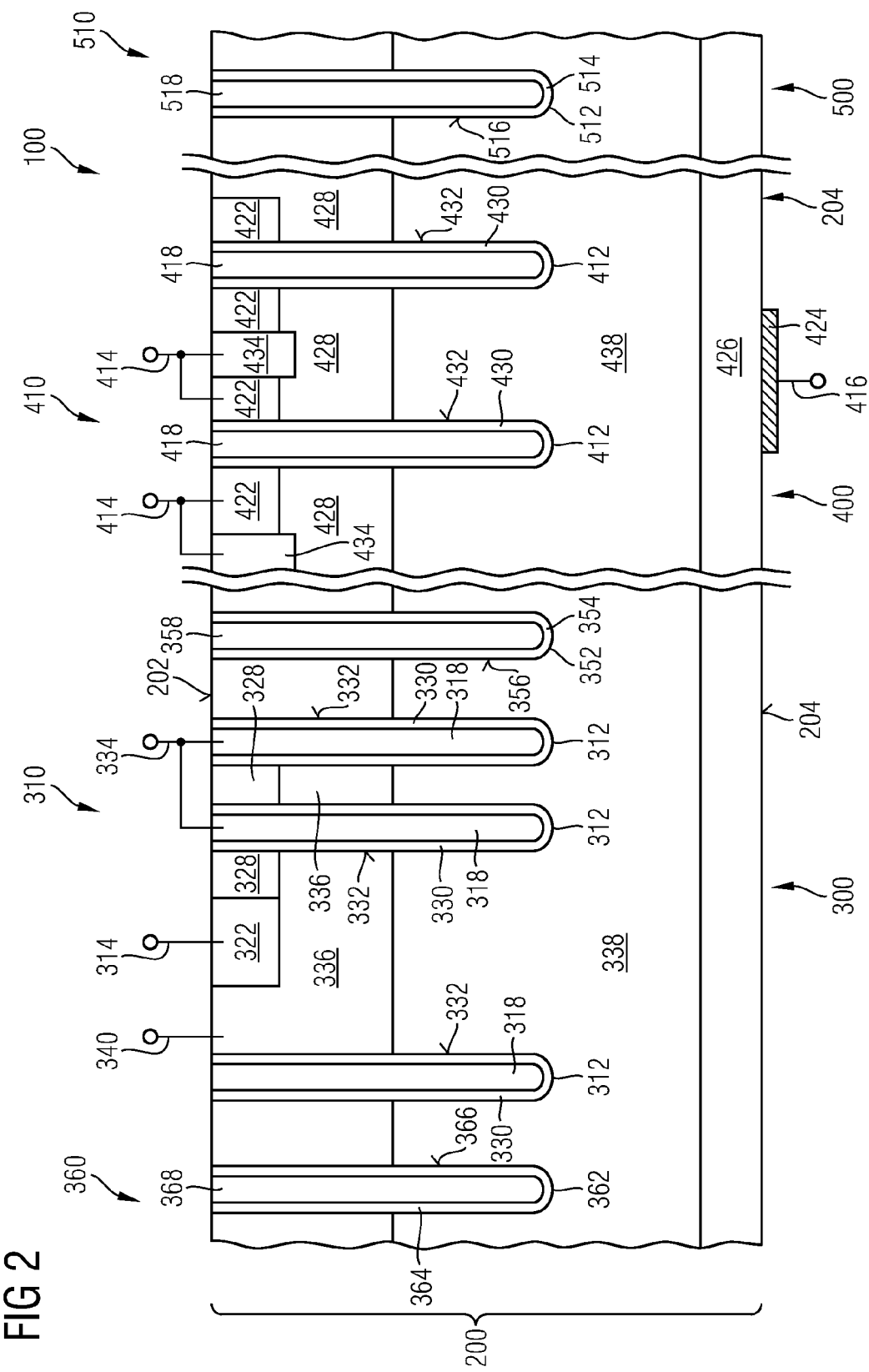
FIG. 2 is a cross-sectional view of the semiconductor device of FIG. 1 taken along the section plane A-A'.

FIG. 1 shows a schematic plan view of one embodiment of a semiconductor device 100. FIG. 2 is a cross-sectional view of the semiconductor device 100 taken from the section plane A-A' as shown in FIG. 1. For illustration purposes of the semiconductor device in cross-section, the schematic cross-sectional view of FIG. 2 is not true to scale with regard to the line A-A' in FIG. 1. In addition, as the semiconductor device 100 is illustrated at different views, in some of these views elements may be visible and denoted by a symbol, whereas the same elements may be invisible at other views. Thus, FIGS. 1 and 2 are to be observed together.

The semiconductor device 100 includes a semiconductor body 200 which may include a semiconductor substrate. The semiconductor body 200 includes semiconductor material such as silicon (Si), silicon carbide (SiC), germanium (Ge), silicon germanium (SiGe), gallium nitride (GaN) or gallium arsenide (GaAs). The semiconductor body may include one or more optional semiconductor layer(s), e.g. epitaxial layer(s), on a semiconductor substrate. Outside the illustrated portion, the semiconductor body 200 may include, inter alia, further doped and undoped sections, epitaxial semiconductor layers, insulating and conducting structures.

The semiconductor body 200 has a first surface 202 and a second surface 204 that is opposite to the first surface 202. The semiconductor device 100 may include a first part 300 with at least one lateral IGFET 310, a second part 400 with at least one vertical IGFET 410 and an edge part 500 with at least one edge termination structure 510.

In the first part 300 of the semiconductor device 100, first trenches 312 extend from the first surface 202 in a vertical direction into the semiconductor body 200. The term "vertical" as used in the specification intends to describe an orientation that is arranged perpendicular to the first surface 202 of the semiconductor substrate or semiconductor body 200.

The lateral IGFET 310 includes a first load terminal 314 at the first surface 202, a second load terminal 316 at the first surface 202 and a gate electrode 318 within the first trench 312. The first load terminal 314 may include a contact pad 320 on the first surface 202 being connected to a source zone 322 directly adjoining the first surface 202 and extending from the first surface 202 into the semiconductor body 200. The second load terminal 316 may include a contact pad 324 being connected to a drain zone 326 directly adjoining the first surface 202 and extending from the first surface 202 into the semiconductor body 200. A channel zone 328 of the lateral IGFET 310 is formed between the source zone 322 and the drain zone 326 of the lateral IGFET 310.

The contact pads 320, 324 of the first load terminal 314 and the second load terminal 316 may include conducting material(s) such as metals(s), metal alloy(s), metal silicide(s), highly doped semiconductor(s), e.g. highly doped polysilicon, aluminum (Al), copper (Cu), AlSi, AlCu or AlSiCu, nickel (Ni), titanium (Ti), silver (Ag), gold (Au), platinum (Pt), palladium (Pd). The contact pads 320, 324 may include metal silicide structures formed selectively along interfaces to the semiconductor body 200.

Both the source zone 322 and the drain zone 326 have a first conductivity type. The first conductivity type may be a n-type. The channel zone 328 between the source zone 322 and the drain zone 326 may have the first conductivity type to form a normally on-type lateral IGFET 310. The channel zone 328 may also have a second conductivity type opposite to the first conductivity type, for example a p-type, to form a normally off-type lateral IGFET. In the case that the channel zone 328 has a first conductivity type, the net dopant concentration of the channel zone 328 may be lower than the doping concentration of the source zone 322 or the drain zone 326.

The channel zone 328 is confined between two opposite of the first trenches 312 resulting in a lateral FINFET structure of the lateral IGFET 310. The first trenches 312 include a gate dielectric 330 lining sidewalls 332 of the first trenches 312 and adjoining the gate electrode 318 within the first trenches 312. The sidewalls 332 of two opposite first trenches 312 thus face side regions of the channel zone 328 to electrically control a current through the lateral IGFET 310 flowing through the channel zone 328 from the source zone 322 to the drain zone 326.

A voltage applied to the gate electrode 318 controls the charge carrier distribution in the channel zone 328. In the case that the channel zone 328 has the first conductivity type, the charge carrier concentration may be reduced or the channel zone 328 be depleted by applying a voltage to the gate electrode 318. In the case that the channel zone 328 has a second conductivity type, charge carriers of the first conductivity type may be, by applying a voltage to the gate electrode 318, accumulated in the channel zone 328 to form a conductive channel between the source zone 322 and the drain zone 326. In an off-state, the source zone 322 is electrically separated from the drain zone 326. The gate electrode 318 may be electrically connected to a contact pad 334 at the first surface 202. The contact pad 334 may have the same material composition as the contact pads 320, 324 or may be formed of any of the materials specified with respect to contact pads 320, 324 above.

An insulating zone 336 is formed in the semiconductor body 200 and configured to electrically insulate the channel zone 328 from a region 338 adjoining the second surface 204, e.g. by pn junction isolation and/or dielectric isolation. The insulating zone 336 may include a well implant zone formed by counter-doping a lightly doped epitaxial layer within the semiconductor body 200, e.g. by introducing implanting impurities of the second conductivity type into a predefined section of the semiconductor body 200 adjoining the first surface 202. Within the well implant zone, the source zone 322, the channel zone 328 and the drain zone 326 may be formed by counter-doping a predefined section of the well implant zone. In case the insulating zone 336 has a second conductivity type, a part of the insulating zone 336 may directly adjoin the first surface 202 to be electrically coupled by a contact pad 340 for defining the electric potential of the insulating zone 336.

The insulating zone 336 may be also a buried zone of a second conductivity type, and may be, for example, formed by deep ion implantation or formed during an epitaxial growth process. The insulating zone 336 may, however, also include a dielectric material for insulating the source zone 322, the channel zone 328 and the drain zone 326 from the region 338 adjoining the second surface 204 of the semiconductor body 200. At lateral side portions, the source zone 322, the drain zone 326 and the channel zone 328 of the first conductivity type of the lateral IGFET 310 need to be electrically isolated from the substrate as well. To this end, either a closed trench ring (not shown) or a well of the second conductivity type extending from the first surface 202 down into the buried insulating zone may be used. This well may be contacted by the contact pad 340. Electrical isolation of the source zone 322, the channel zone 328 and the drain zone 326 in a lateral direction may be further provided by the first trenches 312.

In the first part 300, a lateral IGFET edge termination structure 360 is provided next to the lateral IGFET 310 to secure voltage blocking capability of the lateral IGFET 310. Herein, the lateral IGFET 310 is accompanied by termination trenches 362 comprising a dielectric layer 364 lining sidewalls 366 of the termination trenches 362 and a field electrode 368 within the termination trenches 362 adjoining the dielectric layer 364. The field electrode 368 of the lateral IGFET edge termination structure 360 may be electrically coupled by contact pads 370.

In the second part 400 of the semiconductor body 200 second trenches 412 are formed, which extend in a vertical direction from the first surface 202 into the semiconductor body 200. The second trenches 412 may have the same depth as the first trenches 312 and may be formed simultaneously by, for example, an anisotropic etch process such as dry etching. The term "same depth" encompasses small variations in trench depth caused by trench processing such as RIE (reactive ion etching) lag of simultaneously processed trenches. Thereby, separate processing of the gate structure of the lateral IGFET 310 can be avoided, and, thus one implant mask layer is saved leading to simplified and cost-effective processing.

The second trenches 412 illustrated in FIG. 1 extend in parallel along a lateral direction. Further examples of geometries of the second trenches 412 include shapes of islands and polygons.

A mesa width required to build the channel zone 328 of the lateral IGFET 310 may be smaller than a mesa width of the vertical IGFET 410. Also, a channel mesa of the lateral IGFET 310 may not be wide enough to allow for a direct electrical contact on top. Thus, the mesa region of the lateral IGFET 310 may be widened outside of the channel zone 328 to place a contact on top of the source zone 322 and on top of the drain zone 326. As a result, one common gate trench structure can be used for the vertical IGFET 410 and for the lateral IGFET structure 310, i.e. a normally-on FINFET device can be integrated into a CMOS-DMOS technology.

The distance between two opposite first trenches 312 at the channel zone 328 may be thus lower than two opposite first trenches 312 at the source zone 322 or at the drain zone 326. This allows for a narrow channel portion 328 and at the same time enables easily contacting the source zone 322 and the drain zone 326 by means of, for example, contact pads 320 and 324. The distance between two opposite first trenches 312 confining the channel zone 328 may be smaller than 2 μm, or smaller than 500 nm, or smaller than 200 nm, or even smaller than 50 nm, depending on the dopant concentration in the channel zone 328. A distance between two opposite first trenches 312 at the channel zone 328 of the lateral IGFET 310 may be lower than the distance between two opposite second trenches 412 at a body zone 428 of the vertical IGFET 410. The distance between two opposite first trenches 312 at the channel zone 328 may be 20% to 80% of the distance between two opposite second trenches 412 at the body zone 428.

The at least one vertical IGFET 410 within the second part 400 includes a first load terminal 414 at the first surface 202 of the semiconductor body 200, a second load terminal 416 at the second surface 204 and a gate electrode 418 within the second trenches 412. The first load terminal 414 of the vertical IGFET 410 may include a first contact pad 420 that is electrically connected to a source zone 422. The second load terminal 416 may include a second contact pad 424 that is electrically connected to a common drain zone 426 adjoining the second surface 204. The source zone 422 and the common drain zone 426 have the first conductivity type. Between the source zone 422 and the common drain zone 426, the body zone 428 is formed, which has the second conductivity type. A gate dielectric 430 separates the gate electrode 418 of the vertical IGFET 410 from the body zone 428. The gate dielectric 430 lines sidewalls 432 of the second trenches 412. The gate electrode 418 within the first trenches 412 adjoins an inner side of the gate dielectric 430 of the vertical IGFET 410. The gate electrode 418 may include a conductive material, e.g. highly doped semiconductor material such as polycrystalline silicon, metal(s) and/or metal alloy(s).

A voltage applied to the gate electrode 418 controls a charge carrier distribution in a channel portion of the body zone 428 along the gate dielectric 430. In an on-state, charge carriers of the first conductivity type accumulate in the channel portion adjoining the sidewall 432 of a trench 412 and the gate dielectric 430 and form a conductive channel between the source zone 422 and the drain zone 426. In an off-state, the body zone 428 electrically separates the source zone 422 from the drain zone 426. The body zone 428 may be electrically connected by body contact zones 434, which are electrically connected to body contact pads 436. A drift zone 438 of the first conductivity type is formed between the common drain zone 426 and the body zone 428. The gate electrode 418 may be electrically coupled via a contact pad 440, which may include the same material or material composition as the above-mentioned contact pads 320, 324, 334, 340, 420 or 436.

In the third part 500 of the semiconductor body 200, third trenches 512 are formed, and comprise a field dielectric 514 lining sidewalls 516 of the third trenches 512 and an edge termination electrode 518 adjoining the field dielectric 514 within the third trenches 512. The field dielectric 514 is formed with a higher thickness than a gate dielectric. The third trenches 512 together with the edge termination electrode 518 may surround the cell array of lateral IGFETs 310 and vertical IGFETs 410 in an annular shape. It is also possible that the third trenches 510 surround the vertical IGFET 410 array only. Furthermore, the third trenches 512 could also be located at two opposite side portions of the vertical IGFET 412 array, being parallel to the second trenches 412. Herein, the second trenches 412 may include at their end portions field dielectric structures adjoining a corresponding gate structure. The edge termination electrode 518 may be electrically coupled by means of a contact pad 520. The third trenches 512 may have a comparable depth as the first trenches 312 and the second trenches 412 in case they are simultaneously formed with the first and second trenches 312, 412, e.g. by anisotropic etching.

Figure 3:
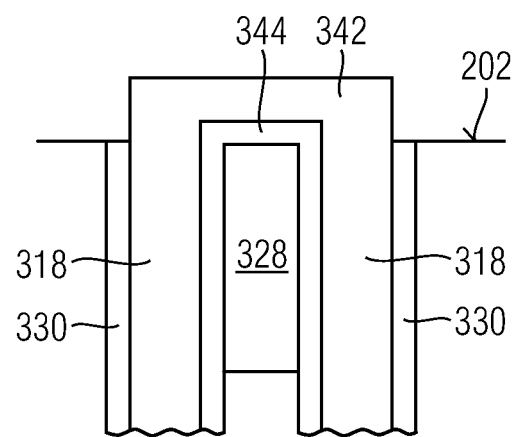
FIGS. 3 to 5 are schematic cross-sectional views of a portion of a semiconductor device in accordance with embodiments of a lateral IGEFT.
Figure 4:
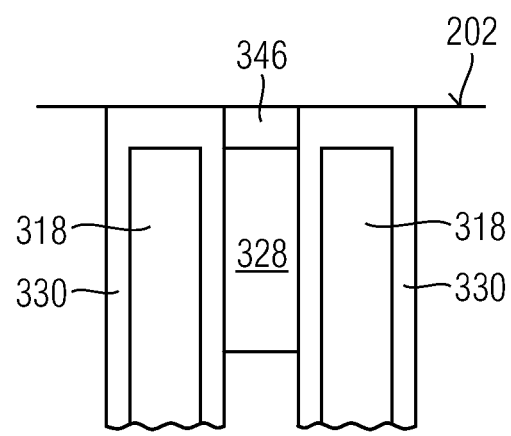
Figure 5:
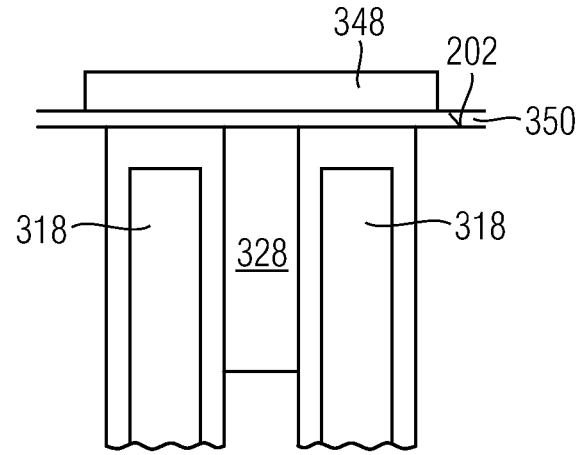

In the following, different embodiments of the gate structure of the lateral IGFET 310 will be described, which are illustrated in FIGS. 3 to 5 in combination with FIGS. 6 to 9. Herein, FIGS. 3 to 5 are detailed cross-sectional views of a portion of the semiconductor device 100 comparable to the cross-sectional view of FIG. 2.

As shown in FIG. 3, the gate electrodes 318 of two opposite first trenches 312 are connected by a gate electrode bridge 342 over the channel zone 328. The channel zone 328 may be separated from the gate electrode bridge 342 by means of a top gate dielectric 344, for example. By employing the gate electrode bridge 342 over the channel 328, a voltage applied to the gate electrode 318 may further induce an electric field from the first surface 202 into the channel zone 328 to support or improve controlling the charge carrier distribution in the channel zone 328.

As the resulting gate structure as shown in FIG. 2 or FIG. 3 to FIG. 5 is comparable to a FINFET gate structure, the lateral IGFET 410 has full gate control over the active channel with a very small bulk effect. As a result, the threshold voltage depends less on the doping level of the channel/body region than in a conventional depletion MOSFET device. Thus, the lateral IGFET 310 has a substantially smaller process variation of the threshold voltage in comparison to a planar depletion MOSFET.

As shown in FIG. 4, in another embodiment, the gate electrode 318 may be buried below the first surface 202. For improving pinch-off properties of the lateral IGFET 310, the channel zone 328 of the lateral IGFET 310 may also be buried below the first surface 202 and facing the buried gate electrode layer 318. A channel insulating zone 346 directly adjoins the first surface 202 and extends in a vertical direction into the semiconductor body 200 at least to a depth of the buried gate electrode 318, to ensure an effective gate control of the channel zone 328 by the gate electrode 318 in a lateral direction. According to one embodiment, the channel insulating zone 346 includes a dielectric. According to another embodiment, the channel insulation zone 346 has a second conductivity type that is opposite to the conductivity type of the channel zone 328, thereby providing pn junction isolation.

In a further embodiment illustrated in FIG. 5, a gate electrode bridge 348 may be formed over the channel zone 328 and separated from the buried gate electrode 318 by a dielectric in the first trenches 312. A further dielectric gate layer 350 may be formed between the channel zone 328 and the gate electrode bridge 348 to electrically separate the gate electrode bridge 348 from the channel zone 328.

In FIGS. 3 to 5, only an upper part of the gate structure of the lateral IGFET 310 is shown, whereas the lower part of the gate structure including the first trenches 312 may be formed as shown in any of FIGS. 6 to 9.

Figure 6:
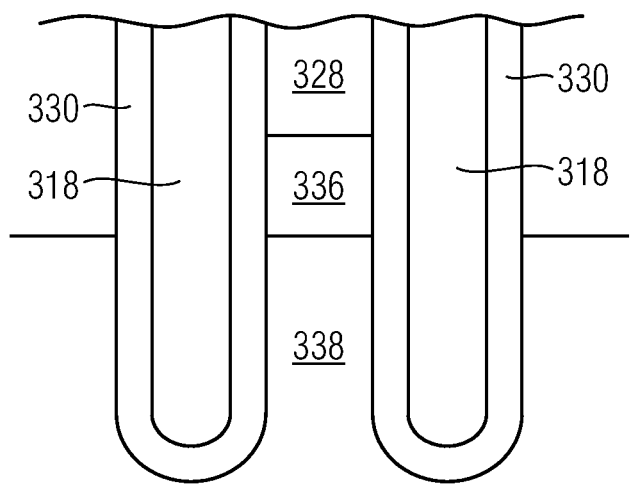
FIGS. 6 to 9 are schematic cross-sectional views of a portion of a semiconductor device in accordance with embodiments including an insulating zone between neighbouring trenches of a lateral IGFET.

FIG. 6 illustrates one embodiment of the gate structure shown in the cross-sectional view of FIG. 2. The first trenches 312 extend through the insulating zone 336 into the region 338 adjoining the second surface 202. As the first trenches 312 may have a same depth as the second trenches 412, the second trenches 412 may act as field plate trenches within the drift zone 438 of the vertical IGFET 410.

Figure 7:
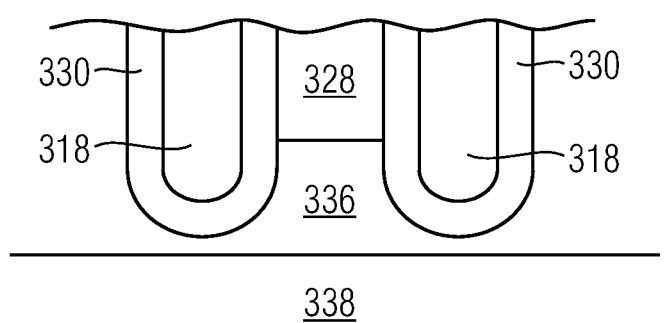

In a further embodiment illustrated in FIG. 7, the trenches 312 end within the insulating zone 336 but extend from the first surface 202 deeper into the semiconductor body 200 than the channel zone 328 and confine the channel zone 328. The trenches 312 of the lateral IGFET 310 thus do not need to be field plate trenches as shown in FIG. 6. The trenches may also be simple gate trenches of a standard trench MOSFET or DMOSFET device. In this instance, the insulating zone 336 extends below the trenches 312 and into the mesa regions so as to ensure electric isolation between the channel zone 328 and the region 338.

Figure 8:
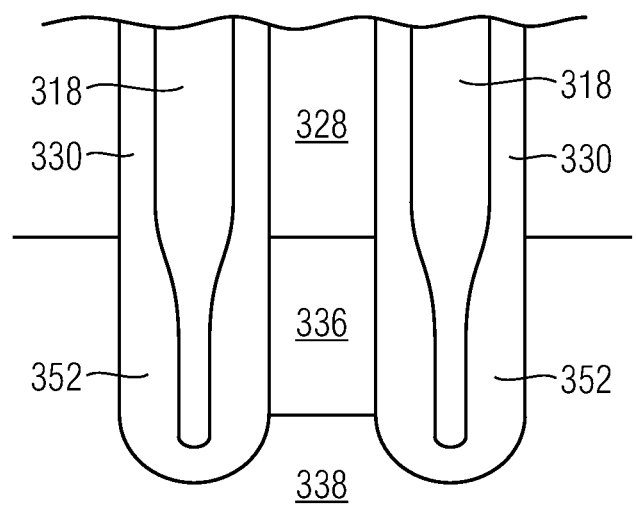

As shown in FIG. 8, the first trenches 312 further include a field dielectric 352 at a lower part of the first trenches 312. The field dielectric 352 is thicker than the gate dielectric 330. As the second trenches 412 may have the same inner structure as the first trenches 312 in a lower part, the lower part may act as field plates in the vertical IGFETs 410. In the structure of FIG. 8, the first trenches 312 extend through the insulating zone 336, which may extend to the same depth into the semiconductor body 200 as the body zone 428 in the second part 400 and which may be processed simultaneously.

Figure 9:
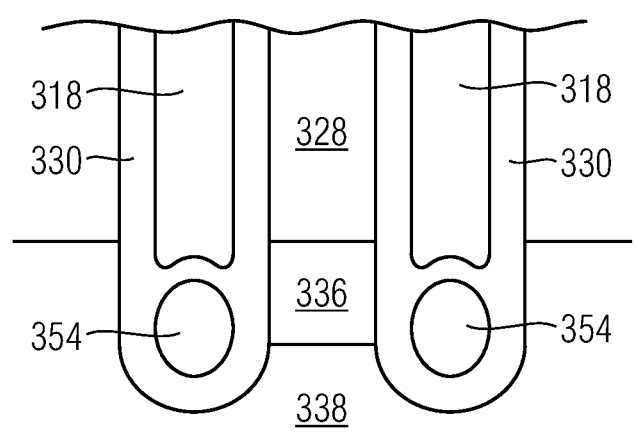

As is illustrated in FIG. 9, the first trenches 312 may further include a field electrode 354 below the gate electrode 318 being electrically separated therefrom by a dielectric layer. The field electrode 354 may be electrically connected in the first part 300 to the source zone 322 or to a body zone, to prevent a parasitic current through a junction isolation zone of the insulating zone 336, or, in other words, to suppress a vertical parasitic bipolar transistor. It is, however, also possible to connect the field electrode 354 to the gate electrode 318, to improve the gate control of the lateral IGFET 310 in a lower part thereof. Since the second trenches 412 may have the same inner structure as the first trenches 312 in a lower part, the field electrode 354 may be contacted in the second part 400 to the source zone 422 of the vertical IGFET 410 acting as a so-called source-poly electrode.

In the above embodiments the dielectrics 330, 430, 364, 514, 350 or 352 may include isolating material(s) such as silicon oxide and/or silicon nitride. The electrodes 318, 318, 418, 518 may include a conductive material, e.g. a highly doped semiconductor material such as highly doped polysilicon, metal(s) and/or metal alloy(s). The common drain zone 426 may be a highly doped semiconductor substrate, e.g. $n^+$-doped or $n^{++}$-doped, which may be formed by ion implantation from the second surface 204. Herein, the region 338 adjoining the second surface may have the same layer structure and net dopant profile as the drain zone 426 and the drift region 438. The drift region 438 may be $n^+$-doped. In addition, the body zone 428 and the insulating zone 336 may have the same layer structure and the same net dopant profile, e.g. due to simultaneous processing in different areas. The body zone 428 and the insulating zone 336 may be p-doped. Furthermore, the source zones 322, 422 and the drain zone 326 may be simultaneously processed and have the same net dopant concentration. The source zones 322, 422 and the drain zone 326 may have be $n^+$-doped. At least the inner structure of the trenches 312, 412, 362 and 512 may be similar, and at least parts thereof may be processed simultaneously. The trenches 312, 412, 362 and 512 may be simultaneously formed by anisotropic etching leading to trenches 312, 412, 362 and 512 having a same depth. By processing parts of the lateral IGFET 310 and the vertical IGFET 410 simultaneously, the number of processes and/or mask steps can be reduced, improving efficiency and costs of production.

FIG. 10 illustrates a schematic process flow of a method of manufacturing a semiconductor device. Process feature S100 includes forming first trenches 312 in a first part 300 of a semiconductor body having a first surface and a second surface opposite to the first surface and forming second trenches in a second part of the semiconductor body. The first and second trenches are thereby formed in such a way that they extend from the first surface into the semiconductor body and have a same depth. Process feature S110 includes forming, in the first part, at least one lateral IGFET comprising a first load terminal at the first surface, a second load terminal at the first surface and a gate electrode within the first trenches. Process feature S130 includes forming, in the second part, at least one vertical IGFET comprising the first load terminal at the first surface, a second load terminal at the second surface and a gate electrode within the second trenches.

According to an embodiment, the method of manufacturing a semiconductor device further comprises process feature S140 including forming an insulating zone configured to electrically insulate the at least one lateral IGFET in the first part from a region adjoining the second surface.

The first trenches and the second trenches may be processed simultaneously.

In conclusion, a conventional planar depletion MOSFET device is replaced by a lateral IGFET 310 acting as a FINFET device. The FINFET device is constructed with structural elements that are already available for processing other devices, e.g. in CMOS-DMOS (complementary metal oxide semiconductor—double-diffused metal oxide semiconductor) technologies with a field plate trench DMOS device. Typically, the devices in such a technology are realized within an n-type epitaxial region on top of the $n^+$ substrate. Then, the channel zone 328 of the FINFET device 310 is an n-doped silicon mesa between two active field plate trenches 312. These trenches 312 comprise gate oxide 330 on the sidewall 332 and a polysilicon gate electrode 318. In the DMOS device 410, this is used to control the vertical MOS channel. In the FINFET device 310, the channel 328 is lateral. It is isolated from the substrate by 336. In modern CMOS-DMOS technologies a buried p-region already is available and used to construct an isolated n well for isolated PMOS (p-channel metal oxide semiconductor) devices. Source zone 322 and drain zone 326 of the FINFET 310 are provided by laterally distanced $n^+$ contacts 320, 324 on top of the mesa region.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor device, comprising:
   a semiconductor body having a first surface and a second surface opposite to the first surface;
   first trenches and second trenches extending from the first surface into the semiconductor body;
   at least one lateral IGFET comprising a first load terminal at the first surface, a second load terminal at the first surface and agate electrode within the first trenches; and
   at least one vertical IGFET comprising a first load terminal at the first surface, a second load terminal at the second surface and agate electrode within the second trenches,
   wherein a channel zone of the lateral IGFET is confined between two of the first trenches that are arranged opposite to one another,
   wherein a distance between the two oppositely arranged first trenches at the channel zone of the lateral IGFET is lower than a distance between two of the second trenches that are arranged opposite to one another and confine a body zone of the vertical IGFET.

2. The semiconductor device of claim 1, wherein the first trenches and the second trenches have the same depth.

3. The semiconductor device of claim 1, wherein a distance between the two oppositely arranged first trenches at the channel zone is lower than a distance between the two oppositely arranged first trenches at a source zone or at a drain zone of the lateral IGFET.

4. The semiconductor device of claim 1, wherein the lateral IGFET is a normally on-device.

5. The semiconductor device of claim 1, further comprising an edge termination electrode adjoining a field dielectric within third trenches.

6. The semiconductor device of claim 1, wherein at least one of the first and second trenches further comprises a field dielectric at a lower part thereof being thicker than a gate dielectric lining side walls thereof.

7. A semiconductor device comprising:
   a semiconductor body having a first surface and a second surface opposite to the first surface;
   a source zone and a drain zone at the first surface;
   a channel zone formed between the source zone and the drain zone;
   an insulating zone configured to electrically insulate the channel zone from a region adjoining the second surface; and
   first trenches extending from the first surface into the semiconductor body deeper than the channel zone and confining the channel zone, the first trenches comprising a gate dielectric lining side walls thereof and further comprising a gate electrode adjoining the gate dielectric,
   wherein a distance between two of the first trenches that are arranged opposite to one another is smaller at the channel zone than at the source zone or at the drain zone.

8. The semiconductor device of claim 7, wherein the gate electrodes of two of the first trenches that are arranged opposite to one another are connected by a gate electrode bridge over the channel zone.

9. The semiconductor device of claim 7, wherein the gate electrode is buried below the first surface.

10. The semiconductor device of claim 9, wherein the channel zone is buried below the first surface and facing the buried gate electrode.

11. The semiconductor device of claim 8, wherein a gate electrode bridge over the channel zone is separated from the buried gate electrode by a dielectric in the first trenches.

12. The semiconductor device of claim 7, further comprising at least one vertical IGFET comprising a first load terminal at the first surface, a second load terminal at the second surface and a gate electrode adjoining a gate dielectric lining side walls of second trenches extending from the first surface into the semiconductor body.

13. The semiconductor device of claim 12, wherein at least one of the first and second trenches further comprises a field dielectric at a lower part thereof being thicker than the gate dielectric.

* * * * *

UNITED STATES PATENT AND TRADEMARK OFFICE
CERTIFICATE OF CORRECTION

PATENT NO. : 9,461,164 B2
APPLICATION NO. : 14/027683
DATED : October 4, 2016
INVENTOR(S) : T. Meyer et al.

It is certified that error appears in the above-identified patent and that said Letters Patent is hereby corrected as shown below:

In the Claims

Column 9, Line 53 Claim 1, change "and agate" to -- and a gate --
Column 9, Line 57 Claim 1, change "and agate" to -- and a gate --

Signed and Sealed this
Twenty-seventh Day of June, 2017

Joseph Matal
*Performing the Functions and Duties of the*
*Under Secretary of Commerce for Intellectual Property and*
*Director of the United States Patent and Trademark Office*